(12) United States Patent
Nguyen et al.

(10) Patent No.: US 7,903,541 B2
(45) Date of Patent: *Mar. 8, 2011

(54) ETHERNET SWITCH WITH CONFIGURABLE ALARMS

(75) Inventors: Yen Teresa Nguyen, Austin, TX (US); Manrique J. Brenes, Corona del Mar, CA (US); Rachel C. Neal, Austin, TX (US); Craig A. Zimmerman, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 77 days.

This patent is subject to a terminal disclaimer.

(21) Appl. No.: 12/261,776

(22) Filed: Oct. 30, 2008

(65) Prior Publication Data

US 2009/0052336 A1 Feb. 26, 2009

Related U.S. Application Data

(63) Continuation of application No. 10/377,066, filed on Feb. 28, 2003, now Pat. No. 7,447,147.

(51) Int. Cl.
*G06F 11/00* (2006.01)
*H04L 1/00* (2006.01)

(52) U.S. Cl. ............... 370/216; 370/242; 714/48

(58) Field of Classification Search .......... 370/216–228, 370/241–242, 244, 246–247, 250–251; 714/1–6, 714/47–57

See application file for complete search history.

(56) References Cited

U.S. PATENT DOCUMENTS

| | | | |
|---|---|---|---|
| 3,696,210 A | 10/1972 | Peterson et al. |
| 4,045,624 A | 8/1977 | Browne |
| 4,388,715 A | 6/1983 | Renaudin et al. |
| 4,660,194 A | 4/1987 | Larson et al. |
| 5,615,224 A | 3/1997 | Cohen |
| 5,651,260 A | 7/1997 | Goto et al. |
| 5,714,938 A | 2/1998 | Schwabl |
| 5,764,482 A | 6/1998 | Meyer et al. |
| 5,771,274 A | 6/1998 | Harris |
| 5,793,922 A | 8/1998 | Kim |

(Continued)

FOREIGN PATENT DOCUMENTS

GB 2310086 8/1997

(Continued)

OTHER PUBLICATIONS

The Patent Office of the People's Republic of China.; Examiner's Third Office Action on Patent Application No. 200480005110.1; 12 pages; translation provided, Dec. 26, 2008.

(Continued)

*Primary Examiner* — Tri H Phan
(74) *Attorney, Agent, or Firm* — Baker Botts L.L.P.

(57) ABSTRACT

According to one embodiment, an Ethernet switch includes a plurality of ports operable to receive and transmit Ethernet traffic. The Ethernet switch also includes system monitoring software operable to receive an indication from a user of a plurality of fault conditions for which generation of an alarm is desired. The system monitoring software is also operable to monitor the Ethernet switch for the plurality of fault conditions and generate a signal indicating a particular one of the plurality of fault conditions has occurred. The Ethernet switch further includes at least one relay responsive to the generated signal that is operable to turn on a respective alarm indicating a particular fault condition has occurred.

20 Claims, 10 Drawing Sheets

U.S. PATENT DOCUMENTS

| | | | |
|---|---|---|---|
| 5,825,618 | A | 10/1998 | Schnoor et al. |
| 5,898,557 | A | 4/1999 | Baba et al. |
| 5,920,264 | A | 7/1999 | Kim et al. |
| 5,973,922 | A | 10/1999 | Kamphuis et al. |
| 6,005,700 | A | 12/1999 | Pressler et al. |
| 6,175,501 | B1 | 1/2001 | Bortolini et al. |
| 6,381,214 | B1 | 4/2002 | Prasad |
| 6,411,506 | B1 | 6/2002 | Hipp et al. |
| 6,452,809 | B1 | 9/2002 | Jackson et al. |
| 6,473,407 | B1 * | 10/2002 | Ditmer et al. ............. 370/252 |
| 6,496,118 | B1 | 12/2002 | Smith |
| 6,549,689 | B2 | 4/2003 | Furuichi et al. |
| 6,633,998 | B1 | 10/2003 | Lau |
| 6,636,478 | B1 | 10/2003 | Sensel et al. |
| 6,661,772 | B2 | 12/2003 | Matsuno et al. |
| 7,194,003 | B2 | 3/2007 | Danner et al. |
| 7,268,690 | B2 | 9/2007 | Nguyen et al. |
| 7,277,295 | B2 | 10/2007 | Zimmerman et al. |
| 7,680,928 | B2 * | 3/2010 | Lean et al. ............. 709/224 |
| 2002/0025710 | A1 | 2/2002 | Payson et al. |
| 2002/0104030 | A1 | 8/2002 | Ahn |
| 2002/0124114 | A1 | 9/2002 | Bottom et al. |
| 2002/0194412 | A1 | 12/2002 | Bottom et al. |
| 2003/0081604 | A1 | 5/2003 | Danner et al. |
| 2003/0081620 | A1 | 5/2003 | Danner et al. |
| 2003/0123453 | A1 | 7/2003 | Ooghe et al. |
| 2003/0135601 | A1 | 7/2003 | Pozzuoli |
| 2003/0163561 | A1 | 8/2003 | Lee et al. |
| 2004/0017779 | A1 | 1/2004 | Chen et al. |
| 2004/0095720 | A1 | 5/2004 | Elo et al. |
| 2004/0179470 | A1 | 9/2004 | Nguyen et al. |
| 2006/0274782 | A1 * | 12/2006 | Rikitake ............. 370/465 |
| 2007/0177523 | A1 * | 8/2007 | Nagami et al. ............. 370/252 |
| 2008/0001765 | A1 * | 1/2008 | Nguyen et al. ............. 340/588 |
| 2008/0239946 | A1 * | 10/2008 | Morita ............. 370/217 |
| 2008/0285186 | A1 * | 11/2008 | Kothari et al. ............. 361/56 |
| 2009/0003192 | A1 * | 1/2009 | Martinotti et al. ............. 370/216 |

FOREIGN PATENT DOCUMENTS

| | | |
|---|---|---|
| WO | WO 02/17039 A2 | 2/2002 |
| WO | WO 02/23676 A1 | 3/2002 |

OTHER PUBLICATIONS

Canadian Intellectual Property Office, Office Action for Application No. 2,473,151, Office Action dated Apr. 28, 2009, received Oct. 5, 2009, 3 pages.

PCT Invitation to Pay Additional Fees (PCT Article 17(3)(a) and Rule 40.1); mailed Aug. 23, 2004 Re: PCT/US2004/005823; filed Feb. 24, 2004 (6 pgs.).

The Patent Office of the People's Republic of China; Examiner's Rejection Decision on Patent Application No. 200480005110.1 transmitted to Baker Botts L.L.P. on May 31, 2010; 8 pages; translation provided.

* cited by examiner

ETHERNET SWITCH WITH CONFIGURABLE ALARMS

CROSS-REFERENCE TO RELATED APPLICATION

This application is a continuation of U.S. application Ser. No. 10/377,066 filed Feb. 28, 2003 and entitled "Ethernet Switch With Configurable Alarms".

TECHNICAL FIELD OF THE INVENTION

This invention relates generally to communications and more particularly to an Ethernet switch with configurable alarms.

BACKGROUND OF THE INVENTION

Ethernet is a standard for communicating both data and voice signals. The use of Ethernet communications in industrial applications is increasing, and in response Ethernet switches particularly designed for industrial applications are being produced. Some such applications include industrial control networks.

Industrial control networks are critical links for the operation of manufacturing and processing equipment. Failure of these networks in the manufacturing operation has safety and financial implications that are generally more serious than a traditional data network in a traditional office application.

SUMMARY OF THE INVENTION

According to one embodiment, an Ethernet switch includes a plurality of ports operable to receive and transmit Ethernet traffic. The Ethernet switch also includes system monitoring software operable to receive an indication from a user of a plurality of fault conditions for which generation of an alarm is desired. The system monitoring software is also operable to monitor the Ethernet switch for the plurality of fault conditions and generate a signal indicating a particular one of the plurality of fault conditions has been met. The Ethernet switch further includes at least one relay responsive to the generated signal that is operable to turn on a respective alarm indicating a particular fault condition has occurred.

Embodiments of the invention may provide numerous technical advantages. Some embodiments may include some, none, or all of the above-described advantages. For example, in one embodiment an Ethernet switch is provided that allows user configurable alarms, for which the user wishes to be informed, as opposed to simply a single alarm that is specified by the switch provider. In addition, in some embodiments, alarms may be specified on a per port basis as well as provided with a particular priority. In that regard, in one embodiment multiple relays are provided that allow the selective activation of more than one alarm, which may be utilized to provide different levels of alarms corresponding to the different priority conditions specified for the various faults. In some circumstances, such embodiments allow more accurate monitoring of an Ethernet switch and the possible prevention of catastrophic failures.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1 through 7B of the drawings, like numerals being used for like and corresponding parts of the various drawings.

Figures 1A, 1B:
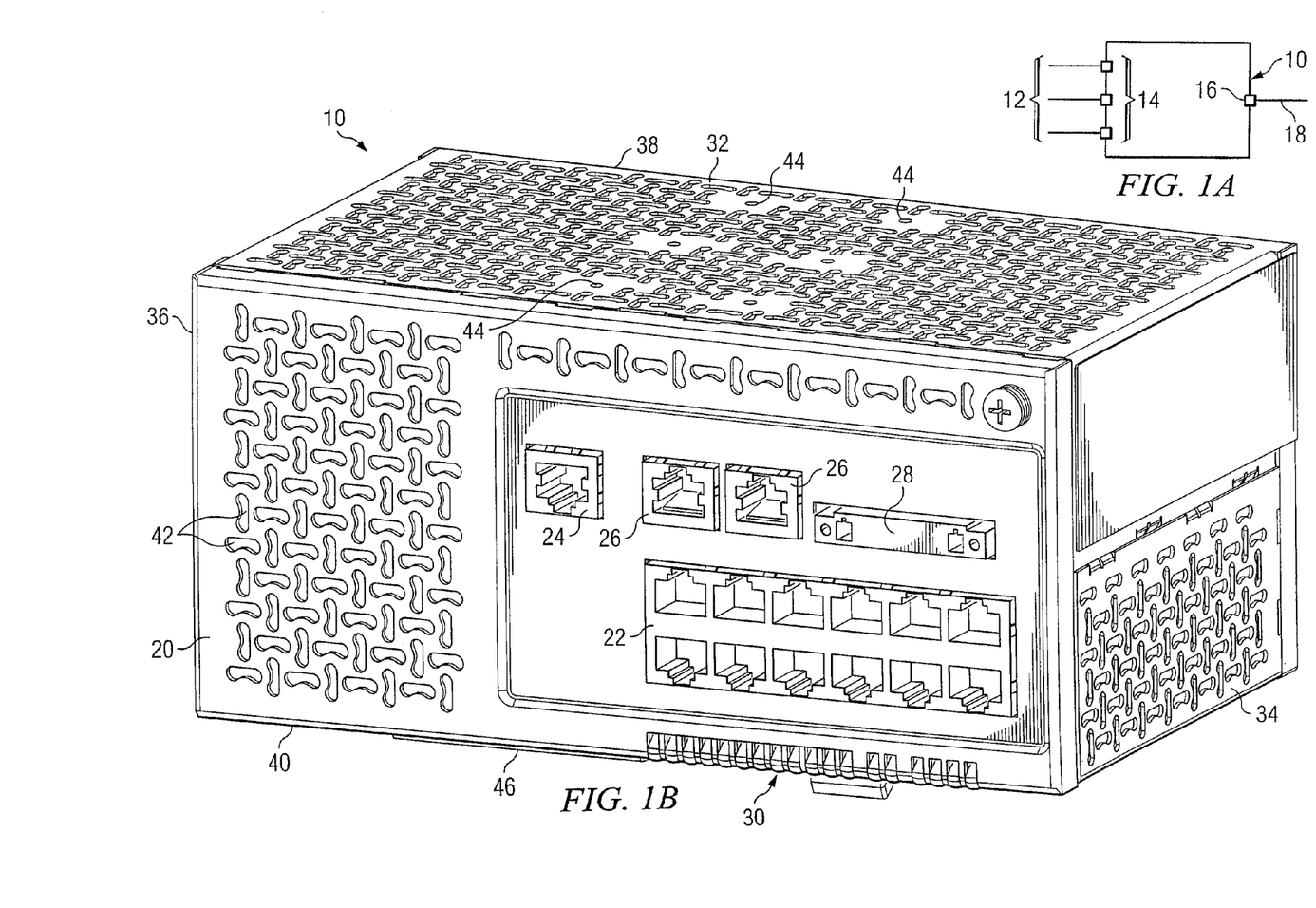
FIG. 1A is a block diagram illustrating an Ethernet switch according to the teachings of the invention.
FIG. 1B is a schematic diagram illustrating a front view of the Ethernet switch of FIG. 1A.

FIG. 1A is a block diagram illustrating an Ethernet switch 10 according to the teachings of the invention. Ethernet switch 10 receives a plurality of lines 12 at respective ports 14. Ethernet switch 10 may selectively couple, or switch, each line 12 to another line 12 or to an uplink 18 through output ports 16. Ethernet switches may be used in a variety of contexts to communicate voice and data to a desired location and may be located in a variety of locations, such as within a central office of a telecommunications carrier or within a manufacturing or industrial environment.

FIG. 1B illustrates an isometric drawing of Ethernet switch 10 according to the teachings of the invention. In this view the front 20 of Ethernet switch is illustrated. Shown on front 20 of Ethernet switch 10 are a plurality of RJ connectors, or ports, 22, a console port 24, two RJ uplink ports 26, a power connector 28, and a plurality of light pipes 30. Ethernet switch 10 also has a top side 32, a right side 34, a left side 36, a back side 38, and a bottom side 40. An edge 46 is formed by front side 20 and bottom side 40.

Formed on the various sides of Ethernet switch 10 are a plurality of apertures 42 for allowing cooling of Ethernet switch 10. Formed on top side 38 are a plurality of mounting holes 44 for mounting a mounting clip (not explicitly shown in FIG. 1B) for facilitating mounting of Ethernet switch 10 to DIN rails during installation in an industrial environment. Although embodiments are described in the context of a rugged Ethernet switch for use in an industrial environment, aspects of the invention are applicable in non-rugged Ethernet switches, except where explicitly noted otherwise.

RJ ports 22 correspond to ports 14 of FIG. 1A. RJ ports 22 may each accept a RJ compatible line carrying voice or data traffic. Console port 24 allows connection to a console for controlling Ethernet switch 10. Link ports 26 provide a connection to another device, such as a router, connected to Ethernet switch 10. Connector 28 provides a location for providing power to Ethernet switch 10 as well as providing a location for user access to the relay connections.

Figure 1C:
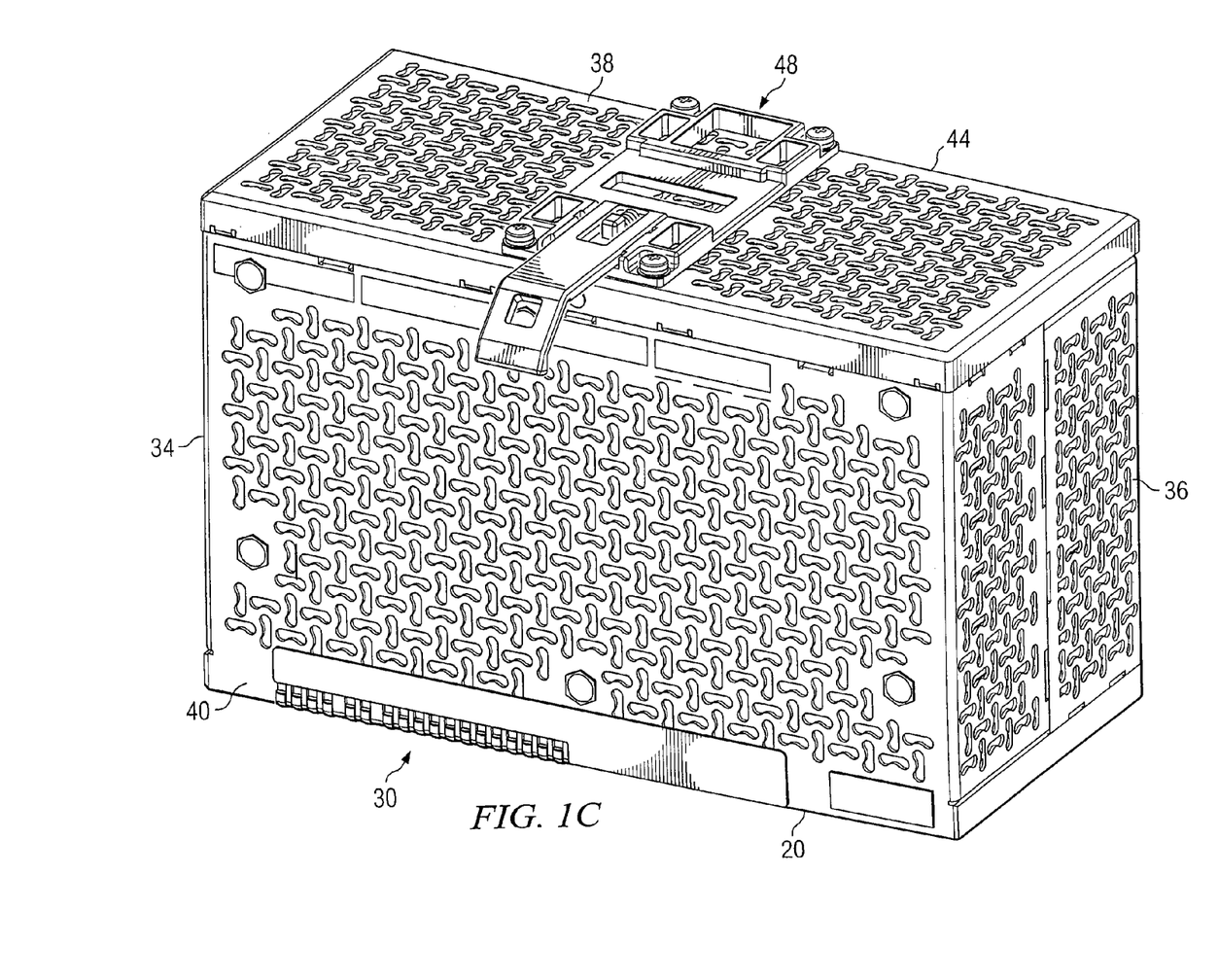
FIG. 1C is a schematic diagram illustrating a bottom view of the Ethernet switch of FIG. 1A.

Light pipes 30 provide an indication of the operation of Ethernet switch 10. Light pipes 30 are provided such that they are visible both when Ethernet switch 10 rests on bottom side 40 as well as when it rests on front side 20 (as shown in FIG. 1C). Thus, when Ethernet switch 10 is installed to rest either on its front side 20 or its bottom side 40, an indication of the operation of Ethernet switch 10 may be provided in either configuration.

FIG. 1C is an isometric drawing of Ethernet switch 10 shown in an alternative orientation. In this orientation, Ethernet switch 10 rests on front side 20. Note that in this configuration, the left and right sides are reversed, as compared to FIG. 1B. Thus, left side 36 is visible in this view. This configuration represents a second installation orientation of Ethernet device 10 with the other likely installation orientation shown in FIG. 1B. Also illustrated in this view is a mounting clip 48, which may be utilized to mount Ethernet switch 10 to DIN rails A plurality of mounting apertures, such as mounting apertures 44, are also formed in back side 38, but are obscured from view by mounting clip 48.

Figure 2A:
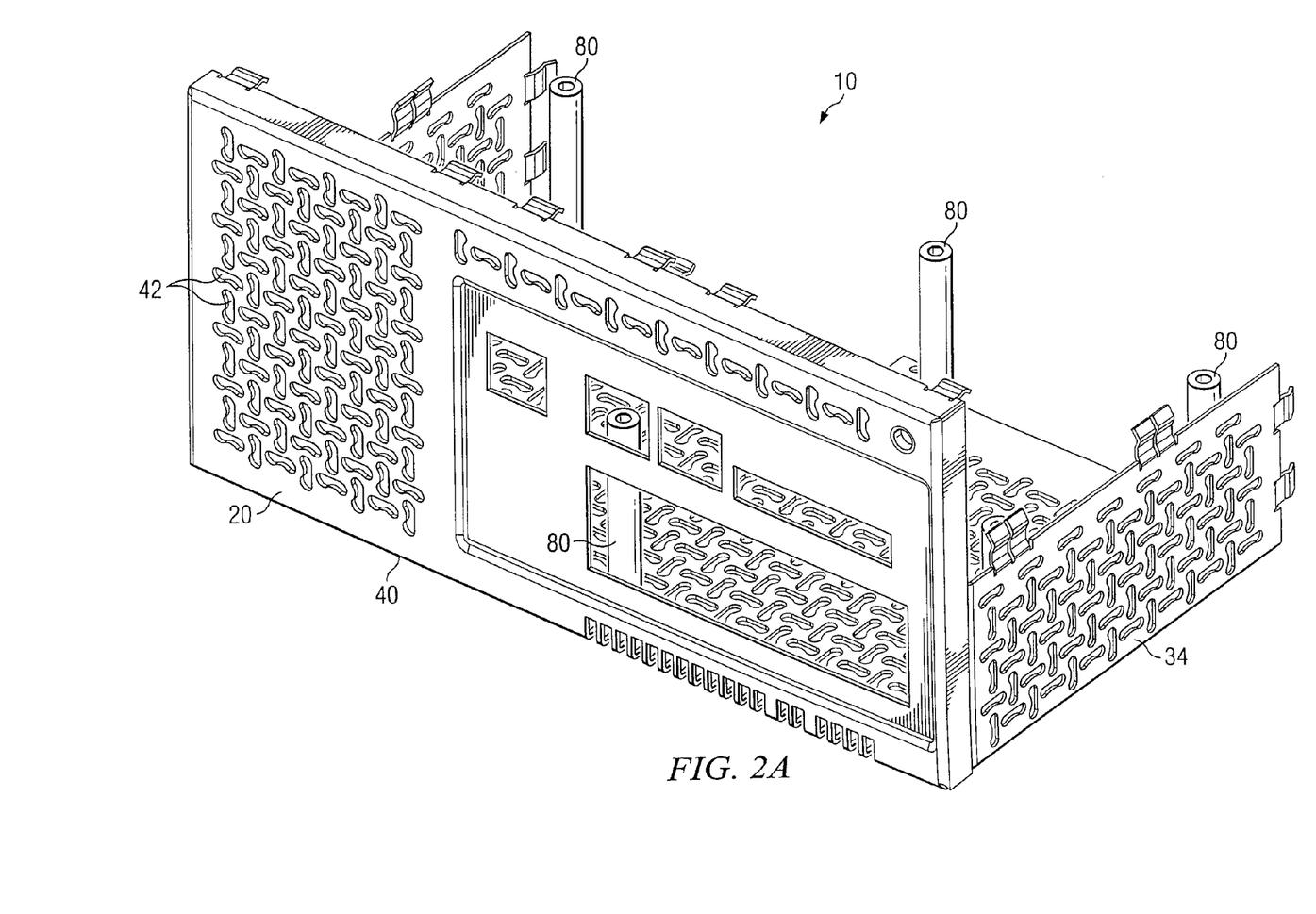
FIG. 2A is an isometric drawing of portions of the interior of the Ethernet switch of FIG. 1B, showing certain elements related to cooling of the Ethernet switch.

FIG. 2A is an isometric drawing showing portions of Ethernet switch 10. In this view, portions of Ethernet switch 10 are deleted so as to render visible spacers 80. Spacers 80 are formed from a generally thermally conductive material, such as aluminum, and operate to both physically support internal cards that perform the main functions of the Ethernet switch as well, as thermally conduct heat from the cards to bottom 40 of the housing of Ethernet switch 10. Thus, heat that is generated by Ethernet switch and transferred to the cards, such as cards 50 or 82 (FIG. 2B) may be conducted to the housing of Ethernet switch 10 for dissipation to the atmosphere. This is one cooling approach utilized. Other approaches are described in greater detail below in conjunction with FIGS. 2B through 3B.

As illustrated, the housing of Ethernet switch 10 is formed with a plurality of apertures 42. Apertures 42 are designed to maximize the surface area of the apertures along the housing of Ethernet switch 10 to allow for heat transfer to the outside atmosphere but at the same time meet electromagnetic emission requirements.

Figure 2B:
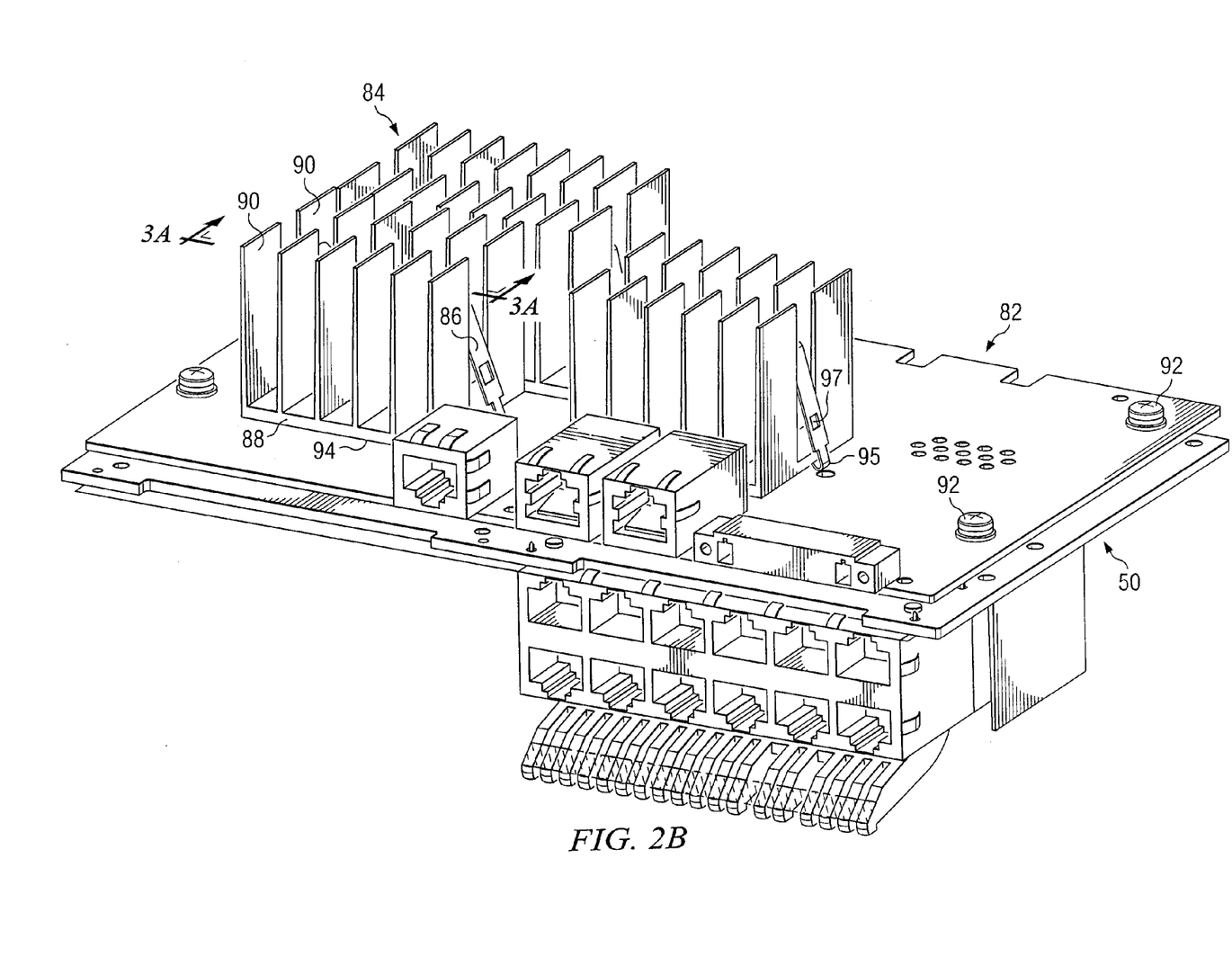
FIG. 2B is an isometric drawing showing two cards that are included within the Ethernet switch of FIG. 1B and associated claim elements.

FIG. 2B is an isometric drawing showing cards 50 and 82 as they would appear positioned within housing of Ethernet switch 10. Card 50 is a PHY card, described above, which includes a plurality of ports and light pipes for indicating the status of the ports or other operations within Ethernet switch 10, as described above. Card 82 houses the CPU for control, an ethernet switch and two alarm relays for external signaling. Disposed on both card 82 and card 50 (see FIG. 2D) are various cooling devices for dissipating heat generated by Ethernet switch 10. Because of the environment in which industrial Ethernet switches are often utilized, passive cooling is required, and thus no convection fans are allowed. This restraint creates challenges for the designer in terms of heat dissipation. Convection fans are allowed for non-industrial switches.

Also illustrated in FIG. 2B are a plurality of heat sinks 84 disposed overlying card 82. Heat sinks 84 are coupled to card 82 through a plurality of elastic clips 86. Elastic clips 86 are shown best in FIG. 3A. Heat sinks 84 are formed with a base portion 88 and a fin portion 90. Disposed between base portion 88 and card 82 (or component on card 82) is a phase change material that changes from a solid to a fluid as it is heated. By changing from a solid to a fluid, voids between the contact of the base portion 88 of heat sinks 84 and card 82, or components overlying card 82, are filled creating a better path for the heat to be conducted across the component/heat sink interface. In one example, the thermal interface material is Thermagon HP105, which changes from solid to liquid phases at approximately 60-65 degrees C. However, other interface materials that change phase from solid to liquid may be used.

Figure 3A:
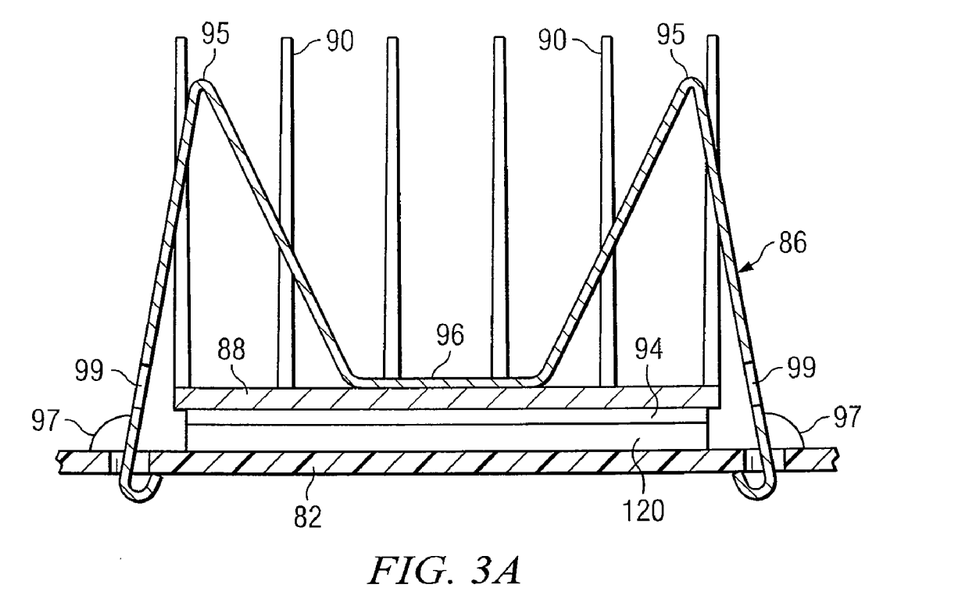
FIGS. 3A and 3B are elevational drawings showing details of clips used to secure heat sinks.
Figure 3B:
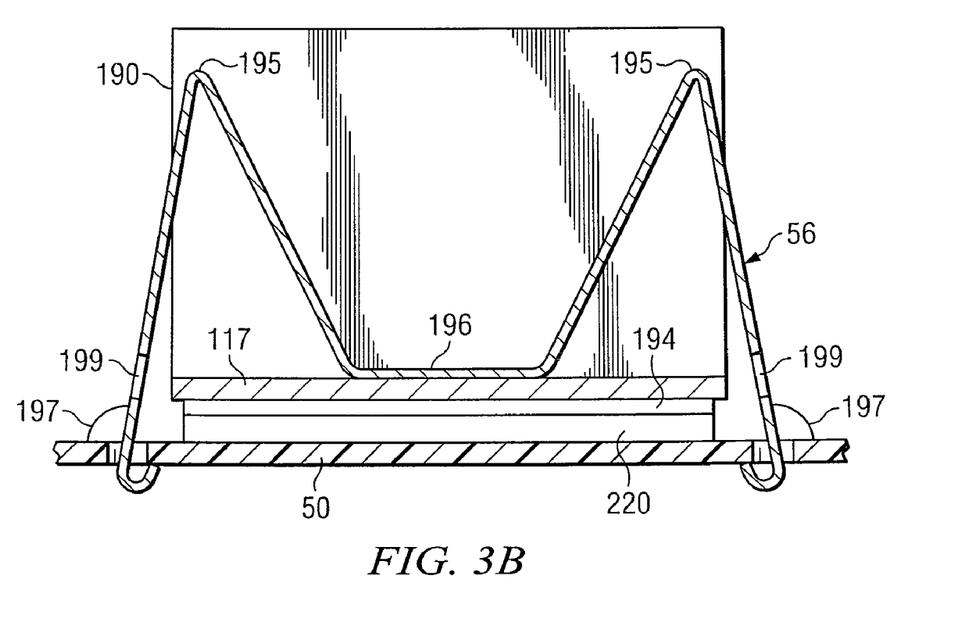

Elastic clips 82 operate to provide an elastic force on base 88 of heat sinks 84 (better illustrated in FIGS. 3A AND 3B). Clips 86 work in conjunction with the phase change material 94 to provide a more conductive path for heat to transfer from components on card 82 to the atmosphere. By providing an elastic force against base 88, clips 86 reduce any space created as the thermal interface material 94 goes through a phase change. Thus, a good thermal contact is maintained between components to be cooled and heat sinks 84. If a conventional fastener were used to connect heat sinks 84 to the components on card 82, the conventional fastener, such as screw, would not necessarily maintain good contact between heat sinks 84 and component overlying card 82 as the thermal interface material changes phase. This is because a pin would not provide sufficient pressure when interface material goes through a phase change.

According to one embodiment, heat sinks 84 are formed from a relatively lightweight material, such as aluminum. However, other materials may be used. The use of a lightweight material both allows better cooling, due to reduced thermal mass and therefore the reduced time to heat fins 90, as well as providing lower inertia, which produces desirable vibration characteristics. The lighter weight heat sinks 84 reach thermal equilibrium quicker than more robust sinks and hence radiate and transfer the heat from the component more rapidly. This maintains a cooler component.

In general, heat generated on a component under heat sinks 84 is conducted through phase change material 94 to base 88 of heat sinks 84. The heat then conducts to fins 90 where, in the illustrated orientation, the predominant heat transfer mechanism is radiation, and fins 90 radiate heat toward housing of Ethernet switch 10. When disposed in a vertical orientation, the predominant heat transfer mechanism is free convection, also known as a chimney effect, and heat transfer occurs through the slow movement of air over fins 90, taking the heat to the housing of Ethernet switch 10.

As described above, spacers 80 (FIG. 2A) support cards 82 and 50 through fasteners 92 and also provide conduction directly from card 82 and 50 to the bottom 40 of Ethernet switch 10. This provides additional heat transfer directly from the cards to the housing of Ethernet switch 10.

Figure 2C:
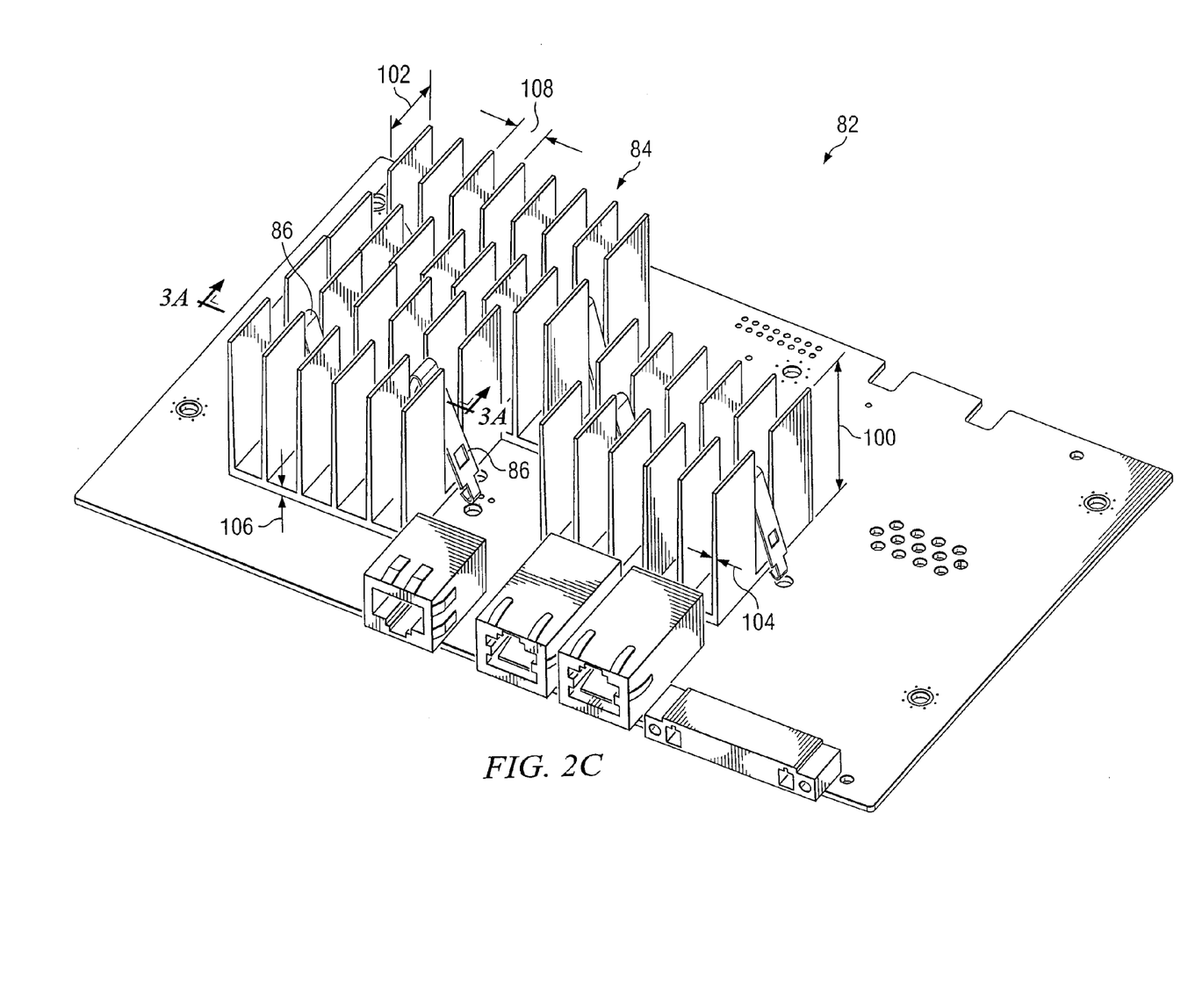
FIG. 2C is an isometric drawing showing a CPU card with copper uplink card of FIG. 2B.

FIG. 2C shows more clearly card 82. Although any suitable orientation of heat sinks 84 may be utilized, a particular configuration is described in detail below. In this configuration, each of the fins 90 of the heat sinks 84 has a height of approximately 1.4 inches, as indicated by reference numeral 100. Fins 84 also have an approximate width of 0.60 inches as indicated by reference numeral 102, and are formed with a thickness of approximately 0.03 inches, as indicated by reference numeral 104. Base 88 is formed with a thickness of approximately 0.9 inches, as indicated by reference numeral 106. The various fins within a given heat sink are spaced apart approximately 0.3 inches as indicated by reference numeral 108. As illustrated some of the heat sinks are formed in groups having six fins and some are formed in groups having eight fins; however, other configurations and numbers of fins may be utilized according to desired heat transfer requirements and card layout. In this embodiment, a lesser number of fins is utilized to accommodate additional components on card 82b.

Figure 2D:
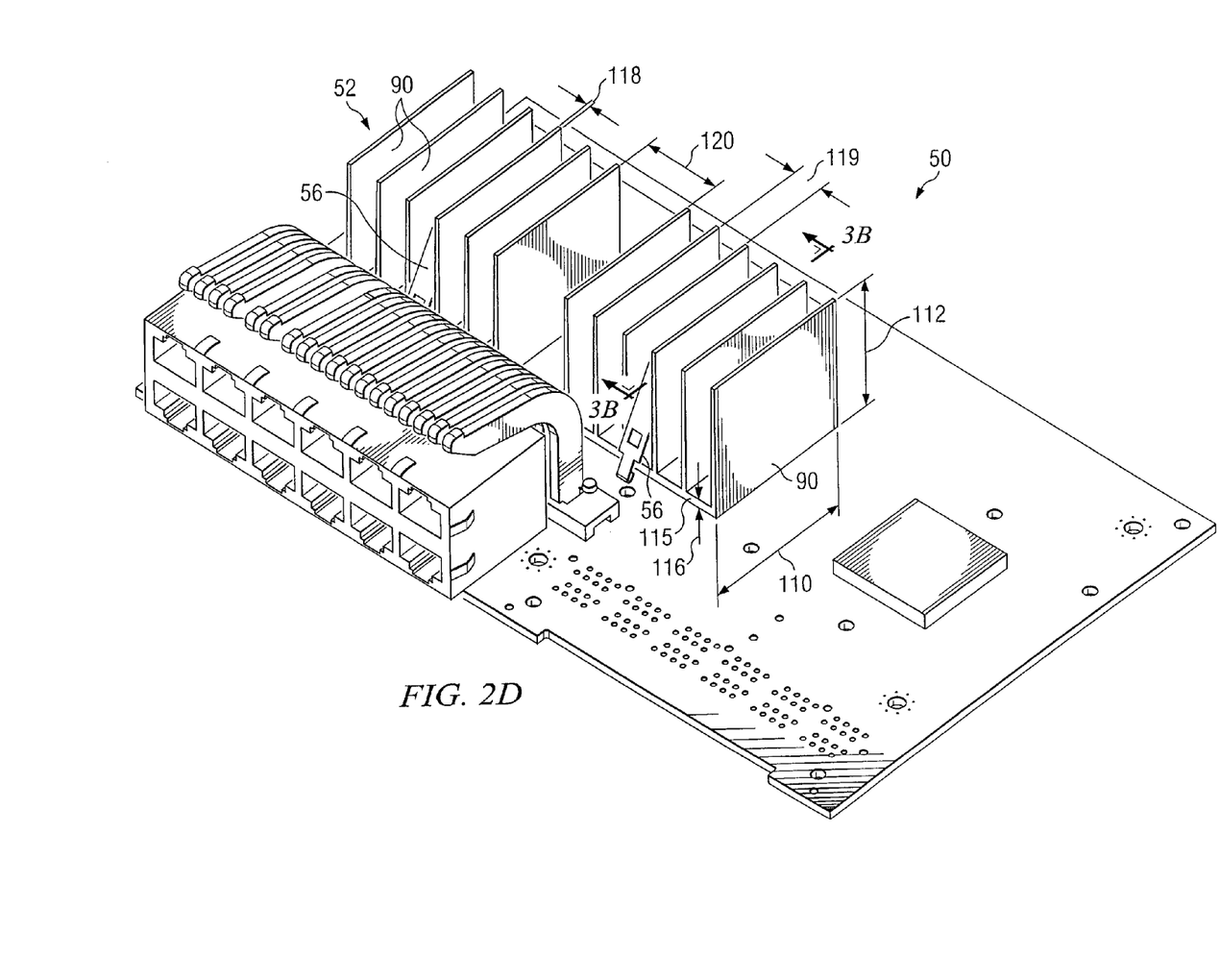
FIG. 2D is an isometric drawing showing the PHY card of FIG. 2B.

FIG. 2D shows a bottom view of card 50. As illustrated, card 50 includes a plurality of heat sinks 52 attached to card 50 via clips 56. Heat sinks 52 are substantially similar to heat sinks 84, except they are oriented differently and have different dimensions. In this particular embodiment, fins 90 have a length of 1.5 inches, as designed by reference numeral 110 and a height of 1.31 inches as designated by reference numeral 112. Fins 90 are formed with a thickness of 0.030 inches as designated by reference numeral 118 and base 115 is formed with a thickness of 0.090 inches as designated by reference numeral 116. In this embodiment, fins 90 are spaced apart by a distance of 0.304 inches, as designated by reference numeral 119 with an irregular spacing of 0.75 inches, as designated by reference numeral 120 to accommodate the board layout. In this embodiment, clip 56, which is substantially similar to clip 86, depresses against base 115 of heat sinks 52 between fins 90. This contrasts with card 82 in which clips 86 depress against base 88 between rows of fins 90.

In addition to the illustrated heat transfer mechanisms, thermal vias may be formed within cards 50 and 82 to further allow heat transfer within Ethernet switch 10.

FIGS. 3A and 3B are partial elevational views of FIGS. 2B and 2D, respectively, along the indicated lines, showing clips 86 and 56. In FIG. 3A, clip 86 is illustrated as having a shape in the general configuration of an M with two side portions 95 and a middle portion 96. On the ends of side portions 95 are hooks 97 for coupling clip 86 to card 82. Clips 86 may also be formed with holes 99 for receiving a tool for attaching clips 86 to card 82. As illustrated, middle portion 96 overlies a base 88 of heat sinks 84. Below base 88 is a phase change material 94, described above, which fills voids between base 88 and a component 120 overlying card 82. Clip 56 of FIG. 3B is analogous to clip 86 except that it is disposed between two fins 90 of heat sinks 90, rather than a cut across the heat sink fins.

Figure 4A:
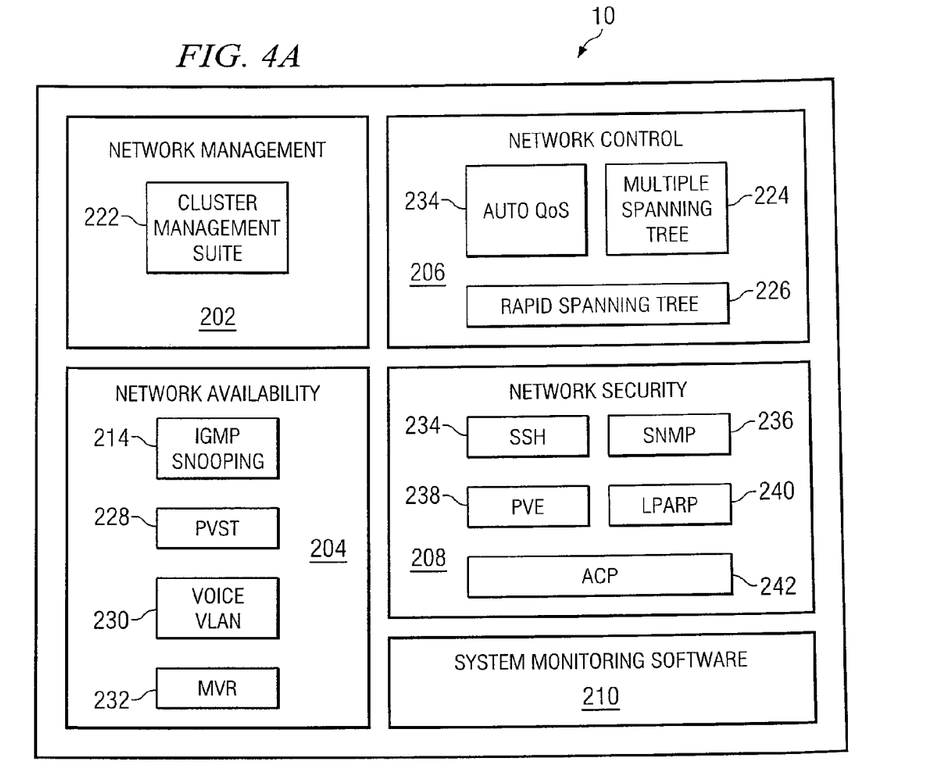
FIG. 4A is a functional block diagram of the Ethernet switch of FIG. 1B.

FIG. 4A is a functional block diagram of Ethernet switch 10, showing various functional groups of Ethernet switch 10. Ethernet switch 10 implements, in one embodiment, a plurality of advanced features. In general, and as described in greater detail below, Ethernet switch 10 implements, in one embodiment, spanning tree protocol (STP) according to IEEE 802.1d, multiple STP according IEEE 802.1s, rapid STP according to IEEE 802.1w, VLAN, dynamic access ports, VLAN query protocol, VLAN membership policy server, dynamic trunk protocol, secure ports, port aggregation protocol, port security MAC aging, IGMP filter, SPAN, RSPAN, protected ports, storm control, IEEE 802.1x Support, IEEE 802.1p, Auto QoS, IEEE 802.1q trunking protocol, network time protocol, access control list L2-L4s time-based ACL, DHCP Option 82, Cluster Management Suite, Cisco intelligence engine 2100, Cisco networking services, Simple Network Management Protocol, remote monitoring, and system crash information. In one embodiment functions corresponding to these groups are programmed in software and stored on a computer readable media, which is executable by a processor of Ethernet switch 10. In other embodiments these functions may be programmed in firmware. The functions of Ethernet switch 10 may generally be grouped into the following categories: network management 202, network availability 204, network control 206, network security 208, and system monitoring 210. These functions may be implemented in a rugged Ethernet switch or a standard switch.

Network management block 202 refers to management functions associated with the network on which Ethernet switch 10 operates. A major portion of network management block 202 comprises cluster management suite 222. In one embodiment, cluster management suite 222 comprises a Cisco Customer Management Suite, available from Cisco Systems, Inc. Cluster management suite 222 generally allows users to manage a plurality of Ethernet switches 10 from a remote device. In one embodiment, up to sixteen switches may be managed through any standard web browser through use of cluster management system 222 regardless of their geographical proximity to each other. In one embodiment, a single IP address may be utilized for an entire cluster of Ethernet switches if desired. Cluster management system 222 provides, in one embodiment, an integrated management interface for delivering intelligent services, which may include multi-layer switching, QoS, multicast, and security access control lists. Thus cluster management system, in one embodiment, allows administrators to take advantage of advance benefits without having to learn the command-line interface, or even details of the underlying technology. Cluster management system 222 allows a network administrator to designate a standby or redundant command switch, which takes the commander duties should the primary command switch fail. Other features of cluster management system 222 include the ability to configure multiple ports and switches simultaneously, as well as perform software updates across each cluster at once, and clone configurations to other clustered switches for rapid network deployment. Bandwidth graphs may be generated by cluster management system 222 as well as link reports, which provide useful diagnostic information and the topology map gives network administrators a quick view of the network status.

In addition to cluster management system 222, network management block 202 may include functionality such as provided by CiscoWorks for Switched Internetworks. The switch cluster management unit 222 may utilize the hot standby router protocol (HSRP) or supporting command switch redundancy.

Network availability block 204 provides functionality associated with maintaining efficient use of resources for bandwidth-hungry applications, such as multicast. In a particular embodiment, an IGMP snooping feature 214 is provided that allows switch 10 to "listen in" on the Internet Group Management Protocol (IGMP) conversation between hosts and routers. When a switch hears an IGMP joined requests from a host for a given multicast group, the switch adds the host's support number to the group destination address (GDA) list for that group and when the switch hears an IGMP leave request, it removes the host port from the content addressable memory table entry.

A PVST block 228 refers to Per VLAN Spanning Tree and allows users to implement redundant uplinks while also distributing traffic loads across multiple links. Additional functionality that enhances performance is voice VLAN 230. This feature allows network administrators to assign voice traffic to a VLAN dedicated to IP telephony, which simplifies phone installations and provides easier network traffic administration and troubleshooting. A multicast VLAN registration block 232 is provided for applications that deploy multicast traffic across an Ethernet network. For example, the multicast VLAN contains the broadcasts of single or multiple video streams over the network. MVR block 232 allows a subscriber on a port to subscribe and unsubscribe to a multicast stream on the network-wide multicast VLAN.

Network control block 206 provides functionality for classifying, prioritizing and avoiding congestion in network traffic. To do this, network control block 206 may include an auto QoS block 234, which detects IP phones or other type of hosts requiring special quality of service features and automatically configures the switch for the appropriate classification and egress queuing. This optimizes traffic prioritization in network availability without the challenge of a complex configuration. Network control block 206 is operable to classify, reclassify, police, and mark or drop the incoming packets before the packet is placed into the shared buffer. Packet classification allows the network elements to discriminate between various traffic flows in enforced policies based on layer 2 and layer 3 QoS field. To implement QoS, network control block 206 first identifies traffic flows, or packet groups, and classifies or reclassifies these groups using the DSCP field in the IP packet and/or the 802.1P class of service (CoS) field in the Ethernet packet. Classification and reclassification can also be based on criteria as specific as the source/destination IP address, source/destination MAC address, or the layer for TCP/UDP ports. At the ingress level, network control 206 also performs policing and marking of the packet.

After the packet goes through classification, policing, and marking, it is then assigned to the appropriate queue before exiting the switch. In one embodiment, four egress queues per port are supported, which allows the network administrator to be more discriminating and specific in assigning priorities for the various applications on the LAN. At the egress level, the network control block 206 performs scheduling, which is a process that determines the order in which the queues are processed. Weighted round-robin scheduling, strict priority scheduling, or other scheduling approaches may be utilized. The weighted round-robin scheduling algorithm assures that lower priority packets are not entirely starved for bandwidth and are serviced without compromising the priority settings administered by the network manager. Strict priority scheduling ensures that the highest priority packets will always get serviced first out of all other traffic, and that the three queues will be serviced using weighted round-robin best effort.

Thus network control 206 allows network administrators to prioritize missions having critical and/or bandwidth-intensive traffic over less time-sensitive applications such as FTP or e-mail. For example, it would be highly undesirable to have a large file download destined to one port or a wiring closet switch and have quality implications such as increased latency in voice or control traffic, destined to another port on this switch. This condition is weighed by ensuring that latency sensitive or critical traffic is properly classified and prioritized throughout the network. Other applications, such as web browsing, can be treated as low priority and handled on a best-effort basis.

Network control block 206 is operable to allocate bandwidth based on several criteria including MAC source address, MAC destination address, IP source address, IP destination address, and TCP/UDP port number. Bandwidth allocation is essential in network environments requiring service-level agreements or when it is necessary for the network manager to control the bandwidth given to certain users.

Also provided within network control block 206 is a multiple spanning tree block 224 and a rapid spanning tree block 226. In general, multiple spanning tree block 224 implements multiple spanning tree protocol (MSTP) according to IEEE 802.1s, which groups VLANs into a spanning tree instance and provides for multiple forwarding paths for data traffic and load balancing. Rapid spanning tree block 226 implements rapid spanning tree protocol (RSTP) according to IEEE 802.1w for providing rapid conversions of the spanning tree by immediately transitioning route and designated ports to the forwarding state. Multiple spanning tree block 224 and rapid spanning tree block 226 are described in greater detail below in conjunction with FIGS. 6A, 6B, and 7.

Network security block 208 provides functionality associated with network security. In one embodiment, network security block 208 offers enhanced data security through a wide range of security features. Such features allow customers to enhance LAN security with capabilities to secure network management traffic through the protection of passwords and configuration information; to provide options for network security based on users, ports, and MAC addresses; and to enable more immediate reactions to intruder and hacker detection. An SSH block 234, standing for secure shell, and a SNMP block 236, standing for simple network management protocol version 3, protect information from being tampered with or eavesdropped by encrypting information being passed along the network, thereby guarding administrative information. A private VLAN edge block 238 isolates ports on a switch, insuring that traffic travels directly from the entry port to the aggregation device through a virtual path and cannot be directed to another port. A local proxy address resolution protocol (LPARP) block 240 works in conjunction with private VLAN edge 238 to minimize broadcasts and maximize available bandwidth. A plurality of port-based access control parameters 242 restrict sensitive portions of the network by denying packets based on source and destination MAC addresses, IP addresses, or TCP/UDP ports. In one embodiment, access control parameters 242 lookups are performed in hardware; therefore, forwarding performance is not compromised when implementing this type of security in the network. In addition, time-based ACLs, standing for Access Control Lists, allow configuration of differentiated services based on time periods. ACLs can be applied to filter traffic based on DSCP values. DSCP stands for Differential Services Code Point. Port security provides another means to ensure the appropriate user is on the network by eliminating access based on MAC addresses.

For authentication of users with a Terminal Access Controller Access Control System (TACACS) or RADIUS server, IEEE Spec. 802.1x provides port-level security. IEEE 802.1x in conjunction with a RADIUS server allows for dynamic port-based user authentication. IEEE 802.1x-based user authentication can be extended to dynamically assign a VLAN based on a specific user regardless of where they connect the network. This intelligent adaptability allows IT departments to offer greater flexibility and mobility to their stratified user populations. By combining access control and user profiles with secure network connectivity, services, and applications, enterprises can more effectively manage user mobility and drastically reduce the overhead associated with granting and managing access to network resources.

With network security block 208, network managers can implement a high level of console security. Multi-level access security on the switch console and the web-based management interface prevents unauthorized users from accessing or altering switch configuration TACACS+ or RADIUS authentication enables centralized access control of the switch and restricts unauthorized users from altering the configuration. Deploying security can be performed through Cisco Cluster Management Systems software 222, described above, which ease the deployment of security features that restrict user access to a server, a portion of the network, or access to the network.

Ethernet switch also includes a system monitoring block 210. In general, system monitoring block monitors various aspects of the Ethernet switch 10.

The teachings of the invention recognize that fault conditions in industrial environments can be particularly disadvantageous, as can fault conditions in typical operations. The teachings of the invention also recognize that in certain operations there are several events, such as exposure to environmental extremes, power supply failures, and data link failures that require the intermediate intervention of an operator nearby in order to minimize the downtime of the network and potential safety issues. The teachings of the invention recognize that to minimize downtime an alarm configuration and monitoring system is desirable that allows user configuration of fault conditions or multiple claims, or both. Thus, according to the teachings of the invention, a method and system are provided that allows a user to configure the fault conditions for which he desires an alarm. As described in greater detail below, fault conditions may be selected from a predefined group, or initially specified by the user. In response, the Ethernet switch is monitored for the specified fault conditions, and in response, upon detection of a particular fault condition, an alarm is initiated. Initiation of the alarm may replace one of a plurality of relays that are provided, which provides the opportunity to have priority levels associated with any particular fault condition. Details of an example embodiment are described below in conjunction with FIGS. 4B through 7B.

Figure 4B:
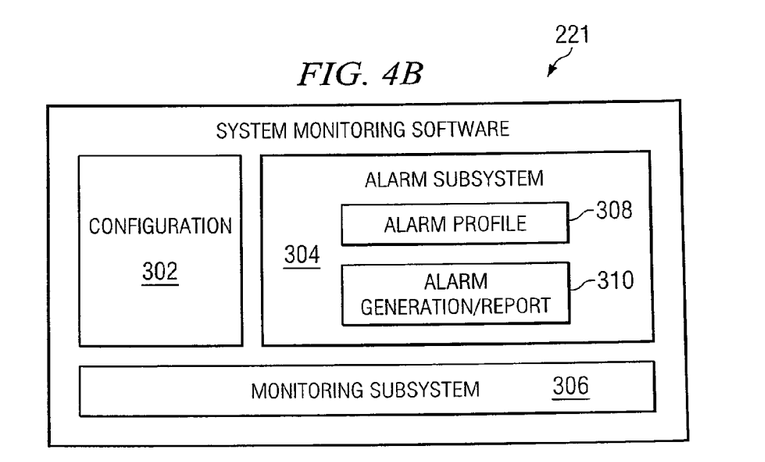
FIG. 4B is a block diagram of the system monitoring system of FIG. 4A, showing additional details of the relay system.

FIG. 4B is a block diagram of system monitoring system 210 of FIG. 4A. System monitoring system 221 includes a configuration subsystem 302, an alarm subsystem 304, and a monitoring subsystem 306. Configuration subsystem 302 allows a user to specify which of a plurality of provided fault conditions for which he wishes an alarm to be generated. Details of one example embodiment of configuration system 302 are provided in conjunction with FIG. 5.

Monitoring subsystem 306 monitors Ethernet switch 10 for each of the plurality of configured fault conditions. If a particular fault condition is detected, the signal is provided to alarm system 304. Details of one example of monitoring subsystem 306 are provided in conjunction with FIG. 6.

Alarm subsystem 304 uses an indication of a fault condition from monitoring system 306 and, in response, generates a signal that is provided to a relay connected to an actual alarm. The alarm may be generated such that a user is informed of the fault condition. Alarm subsystem 304 may include an alarm profile module 308 and an alarm generation report module 310. Alarm profile module 308 updates alarm profiles for which alarms are enabled and/or disabled through configuration block 302. Alarm generation report module 310 executes enabled alarms in response to a signal received from monitoring subsystem 306. Additional details of one embodiment of alarm subsystem 304 are described in greater detail in conjunction with FIGS. 7A and 7B.

Figure 4C:
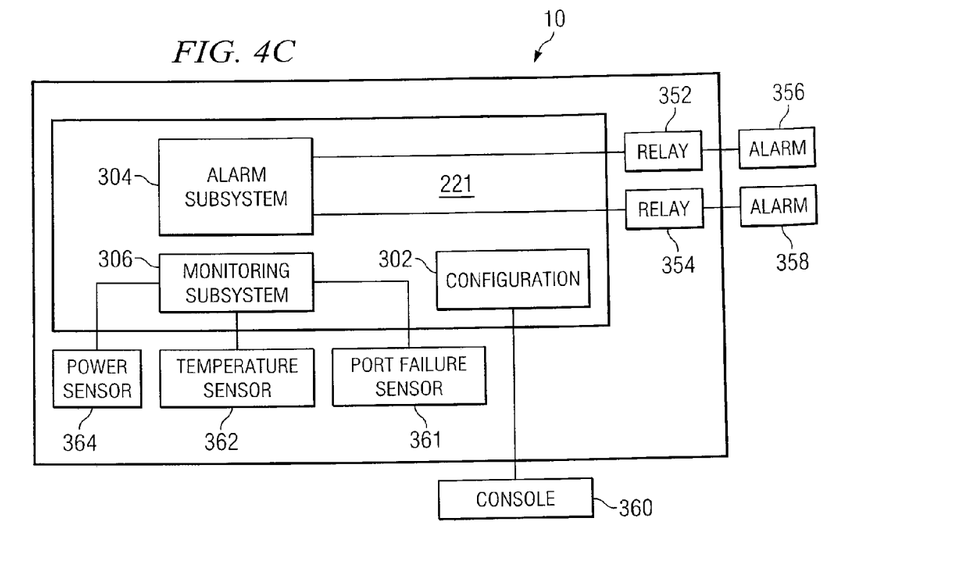
FIG. 4C is a block diagram showing portions of the system monitoring system of FIG. 4B in conjunction with hardware associated with the monitoring system.

FIG. 4C is a block diagram of portions of system monitoring system 221 showing a connection to physical devices to which system monitoring system 221 is attached. As illustrated, configuration subsystem 302 may be coupled to a console 360. Console 360 may be a personal computer, terminal, or other device that allows data to be inputted into Ethernet switch 10. In this manner, a user may key in particular fault conditions to configure system monitoring system 221. Also illustrated are a pair of relays 352 and 354 coupled to alarm subsystem 304. Relays 352 and 354 may be any suitable relay that is operable to receive its signal indicating relays should be turned on and in response turn on an associated alarm. In this embodiment, alarms 356 and 358 are depicted as external to system monitoring system 221 as well as Ethernet switch 10, which may be a usual case. However, alarms such as alarms 356 and 358 may be included within Ethernet switch 10 if desired. In addition, more than two relays may be provided, as desired. A temperature sensor 362, a power sensor 364 and a port failure sensor 361 are illustrated as being coupled to monitoring subsystem 306. Port failure sensor 361 provides information to monitoring subsystem regarding pre-defined port conditions, such as link fault and nonforwarding ports. Temperature sensors 362 and power sensor 364 may be formed internal to Ethernet switch 10, or may be external sensors, and may take any suitable term that allows measurement of temperature and power, respectively.

Figure 5:
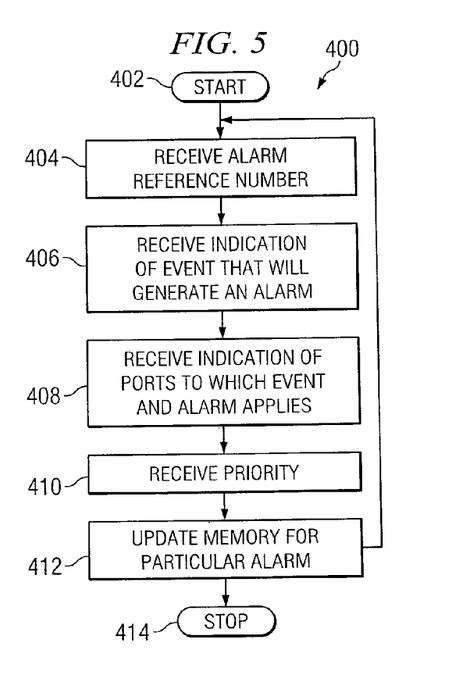
FIG. 5 is a flowchart illustrating a method for user configuration of alarms for the Ethernet switch of FIG. 1A.

FIG. 5 is a flowchart showing a method 400 for configuring fault conditions for Ethernet switch 10. This method may be implemented by configuration module 302 of system monitoring system 221, or may be implemented by other software stored on Ethernet switch 10. The method begins at step 402. At step 404, an alarm reference number is received. The alarm reference number corresponds to a particular one of a plurality of possible alarms corresponding to all fault conditions for which detection is sought. In a particular embodiment six possible alarms and corresponding fault conditions are allowed; however, other numbers of alarms may be utilized. This reference number may be received from a user operating console 360, or through other suitable techniques.

At a step 406, an indication is received of an event that will generate an alarm. Possible events that will generate an alarm include: a link fault, which corresponds to a physical layer fault such as a bad wire; a port not forwarding fault, which corresponds to the condition in which one of ports 22, 24, or 26 is not forwarding data; a port is not operating fault, indicating a port is not operating; an error count threshold crossed, which indicates too high of an error rate; a temperature threshold crossed fault, indicating a particular threshold has been met, corresponding to too high or too low of a temperature for Ethernet switch 10; or a loss of power fault, indicating that power has been lost for Ethernet switch 10 or is otherwise unacceptable. These possible faults are provided for example purposes only, and other possible faults may be specified. According to one embodiment, an indication is provided to the user of each of these faults and the user is queried as to whether any one of these should generate a fault condition.

At a step 408, an indication is received of the ports to which the fault condition that will generate an alarm applies. Thus, each of the specified fault conditions may be applied to selected ports rather than all ports at once. Steps 406 and 408 may be performed together. At a step 410, a priority is specified for the indicated event that will generate an alarm. According to one embodiment, a priority may be high or low, depending on the severity of the fault condition. According to other embodiments, more than two priorities may be specified. At a step 412, the entered data is updated in memory for any particular fault condition. This memory is accessible by alarm subsystem 304. Processing returns to step 404 and continues through these series of steps until all fault conditions have been specified. The method concludes at step 414.

Thus, according to the teachings of the invention, particular faults conditions relevant to a particular user and environment may be specified by the user such that the user receives timely notification of fault conditions for only those faults that are important to him.

Figure 6:
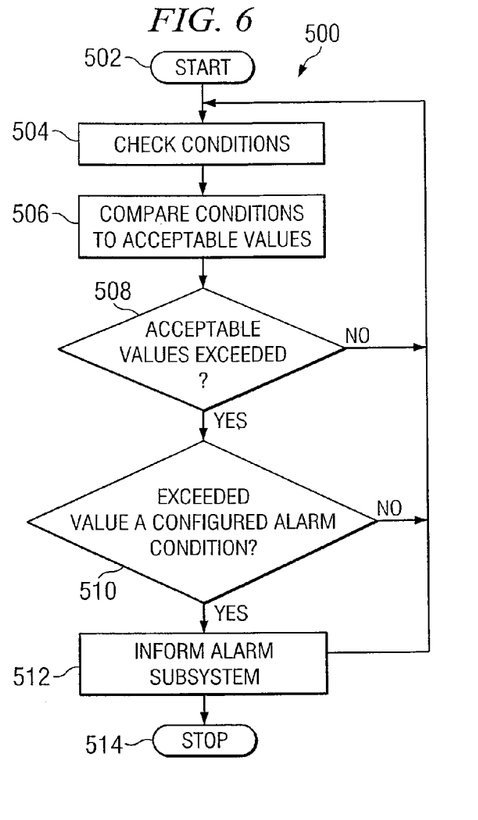
FIG. 6 is a flowchart illustrating a method for monitoring fault conditions associated with the Ethernet switch of FIG. 1A.

FIG. 6 is a flowchart illustrating a method 500 for monitoring Ethernet switch 10 for a plurality of fault conditions configured by method 400. Method 500 may be implemented by monitoring subsystem 306 or by other suitable software on Ethernet switch 10. The method begins at step 502. At step 504 a plurality of possible fault conditions 504 are periodically checked. In one embodiment, all possible fault conditions are checked, whether or not the user has specified the particular fault condition should generate an alarm. At step 506 the particular fault parameter is compared to a predetermined value, and at step 508 it is determined whether the current fault condition exceeds acceptable levels. If the current fault condition exceeds acceptable levels a determination is made at step 510 of whether the fault condition should generate an alarm. This determination is based upon whether the fault condition has been configured to generate an alarm, as described above in connection with FIG. 5. At step 512, an indication is provided to an alarm subsystem for handling the alarm. The method concludes at step 514. If particular measured values do not exceed fault thresholds or a fault condition should not generate an alarm, processing continues back at step 504 at which all conditions are checked at periodic intervals. It will be understood that if only fault conditions that are configured by the user to generate an alarm are checked, step 510 would not be performed.

Thus, according to the teachings of the invention, potential fault conditions are monitored and a signal is generated indicting the fault conditions may exceed acceptable levels. In this regard, a temperature sensor and a power sensor, such as sensors 362 and 364, may be utilized.

Figure 7A:
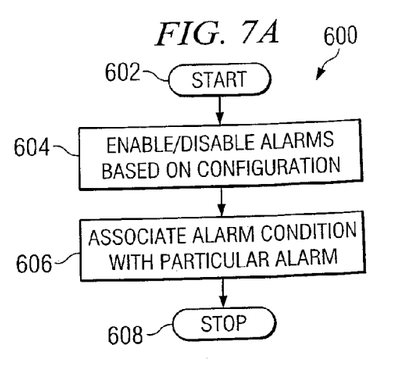
FIG. 7A is a flowchart illustrating a method for enabling or disabling alarms based on the configuration of fault conditions.

FIG. 7A illustrates a method 600 for generating an alarm profile. Such a method 600 may be executed by alarm profile module 308, or through other suitable software on Ethernet switch 10. The method begins at step 602. At step 604 particular alarms are enabled or disabled based upon the configuration performed by method 400. At step 606 specific alarms are associated with specific fault conditions, again according to the configuration performed by method 400. Such association may involve matching particular alarms with the priority level designated for the particular fault condition. For example, a power failure fault may correspond to turning on a red light, where a port not forwarding fault may correspond to turning on a blue light. Thus, according to the teachings of the invention, different levels of severity of conditions may be indicated to a user by differentiation in the alarms. It will be understood that other techniques may be utilized for differentiating alarms such as different sounds or other visual indications. Furthermore, it will be understood that the use of two alarms may provide new bits of data for which four different levels of priority may be utilized. The method concludes at step 608.

Figure 7B:
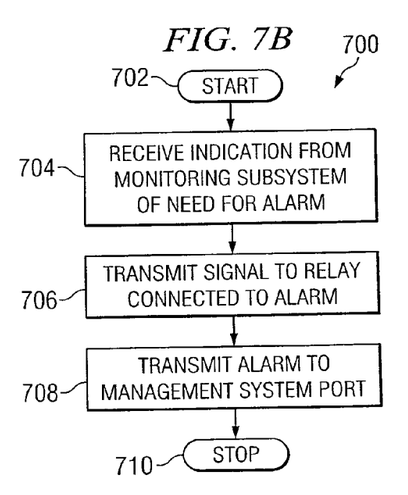
FIG. 7B is a flowchart illustrating a method for initiating an alarm in response to a detected fault condition.

FIG. 7B illustrates a method 700 for generating an alarm in response to a detected fault condition. Method 700 may be performed by alarm generation report module 310 or by other suitable programming on Ethernet switch 10. The method begins at step 702. At step 704 an indication is received from monitoring subsystem 306 of a need for an alarm. This corresponds to a detected fault condition for which a user has configured an Ethernet switch to generate an alarm. At a step 706 a signal is transmitted to a relay connected to the alarm associated with the particular fault condition. This allows the relay to turn on a particular alarm associated with the particular fault condition. In addition, at a step 708, an alarm report specifying details of the fault condition may be sent to a management system, such as console 360 or an SNMP server. SNMP traps may be generated and sent to an SNMP server, if enabled. The method concludes at step 710.

Although some embodiments of the present invention have been disclosed in detail, it should be understood that various changes, substitutions, and alterations can be made thereto without departing in spirit and scope of the invention as defined by the appended claims.

What is claimed is:

1. An Ethernet switch comprising:
a plurality of ports operable to receive and transmit Ethernet traffic;
system monitoring software operable to:
receive an indication from a user of a plurality of fault conditions for which generation of an alarm is desired;
monitor the Ethernet switch for the plurality of fault conditions; and
generate a signal indicating a particular one of the plurality of fault conditions has occurred; and
at least one relay responsive to the generated signal and that is operable to turn on a respective alarm indicating the particular fault condition has occurred.

2. The Ethernet switch of claim 1, wherein the at least one relay comprises at least two relays.

3. The Ethernet switch of claim 1, wherein the system monitoring software is further operable to receive an indication from a user of a plurality of fault conditions classified on a per port basis for which generation of alarm is desired.

4. The Ethernet switch of claim 1, wherein the system monitoring software is further operable to receive an indication from a user of a plurality of fault conditions specified globally for all ports for which generation of alarm is desired.

5. The Ethernet switch of claim 2, wherein the plurality of fault conditions comprise fault conditions having one of two priorities associated with a particular alarm.

6. The Ethernet switch of claim 1, wherein the plurality of fault conditions comprises a link fault.

7. The Ethernet switch of claim 1, wherein the plurality of fault conditions comprises a port not forwarding fault.

8. The Ethernet switch of claim 1, wherein the plurality of fault conditions comprise a port not operating fault.

9. The Ethernet switch of claim 1, wherein the plurality of fault conditions comprises an error count threshold crossed fault.

10. The Ethernet switch of claim 1, wherein the plurality of fault conditions comprises a temperature threshold crossed fault.

11. The Ethernet switch of claim 1, wherein the plurality of fault conditions comprises a loss of power fault.

12. The Ethernet switch of claim 1, wherein the system monitoring software is further operable to generate a report having details of the fault condition that has occurred.

13. The Ethernet switch of claim 1, wherein the Ethernet switch further comprises an alarm.

14. A method for generating alarms in an Ethernet switch comprising:
receiving an indication from a user of a plurality of fault conditions for which generation of an alarm is desired;
automatically monitoring the Ethernet switch for the plurality of fault conditions;
generating a signal indicating a particular one of the plurality of fault conditions has occurred; and
providing the generated signal to a relay that is operable to turn on a respective alarm indicating the particular fault condition has occurred.

15. The method of claim 14, and further comprising:
generating a second signal indicating a second particular one of the plurality of fault conditions has occurred; and
providing the second generated signal to a second relay.

16. The method of claim 14, wherein receiving an indication from a user comprises receiving an indication from a user on a per port basis of a plurality of fault conditions for which generation of an alarm is desired.

17. The method of claim 14, wherein the plurality of fault conditions is selected from a group consisting of a link fault, a port not forwarding fault, a port not operating fault, an error count threshold crossed fault, a temperature threshold crossed fault, and a loss of power fault.

18. The method of claim 14, and further comprising generating a report having details of the particular one of the plurality of fault conditions that has been met.

19. The method of claim 14, wherein receiving an indication from the user of a plurality of faults comprises receiving an indication from a user of a plurality of faults in conjunction with respective priorities specified by the user.

20. An Ethernet switch comprising:
- means for receiving an indication from a user of a plurality of fault conditions for which generation of alarm is desired;
- means for automatically monitoring the Ethernet switch for the plurality of fault conditions;
- means for generating a signal indicating a particular one of the plurality of fault conditions has occurred; and
- relay means for turning on a respective alarm indicating the particular fault condition has occurred.

* * * * *